(12) United States Patent
Barbastathis et al.

(10) Patent No.: US 8,427,630 B2
(45) Date of Patent: Apr. 23, 2013

(54) SEMICONDUCTOR MANUFACTURING APPARATUS

(75) Inventors: George Barbastathis, Boston, MA (US); Jose Antonio Dominguez-Caballero, Portland, OR (US); Sung Jin Lee, Hwaseong-si (KR); Satoshi Takahashi, Cambridge, MA (US)

(73) Assignees: Samsung Electronics Co., Ltd., Gyeonggi-do (KR); Massachusetts Institute of Technology, Cambridge, MA (US)

( * ) Notice: Subject to any disclaimer, the term of this patent is extended or adjusted under 35 U.S.C. 154(b) by 289 days.

(21) Appl. No.: 12/805,735

(22) Filed: Aug. 17, 2010

(65) Prior Publication Data

US 2011/0042588 A1 Feb. 24, 2011

Related U.S. Application Data

(60) Provisional application No. 61/235,743, filed on Aug. 21, 2009.

(51) Int. Cl.
*G03B 27/54* (2006.01)
*G03B 27/72* (2006.01)

(52) U.S. Cl.
USPC .............................................. 355/67; 355/71

(58) Field of Classification Search .............. 355/52, 355/53, 55, 67–71; 250/492.2, 548; 356/399–401
See application file for complete search history.

(56) References Cited

U.S. PATENT DOCUMENTS

| 5,600,485 | A | * | 2/1997 | Iwaki et al. | 359/561 |
|---|---|---|---|---|---|
| 5,900,637 | A | * | 5/1999 | Smith | 250/492.22 |
| 6,841,787 | B2 | * | 1/2005 | Almogy | 250/492.24 |
| 6,897,941 | B2 | * | 5/2005 | Almogy | 355/67 |
| 2004/0263818 | A1 | * | 12/2004 | Kluter et al. | 355/67 |

* cited by examiner

*Primary Examiner* — Hung Henry Nguyen
(74) *Attorney, Agent, or Firm* — Harness, Dickey & Pierce, P.L.C.

(57) ABSTRACT

Disclosed herein is a semiconductor manufacturing apparatus. The semiconductor manufacturing apparatus precisely adjusts the position and size of a light spot formed on a substrate, enabling formation of a target pattern or elimination of an unnecessary pattern in an accurate and rapid manner. The semiconductor manufacturing apparatus includes a light source, a light modulator to modulate light irradiated from the light source into a plurality of beams to correspond to a target pattern, a diffraction element to adjust a direction of each of the plurality of beams, and an optics system to allow the plurality of beams, the direction of which has been controlled by the diffraction element, to form a light spot having a target size.

16 Claims, 6 Drawing Sheets

SEMICONDUCTOR MANUFACTURING APPARATUS

CROSS-REFERENCE TO RELATED APPLICATION

This application claims the benefit of U.S. Patent Application No. 61/235,743, filed on Aug. 21, 2009 in the USPTO, the disclosure of which is incorporated herein by reference.

BACKGROUND

1. Field

Embodiments of the present invention relate to a semiconductor manufacturing apparatus to pattern a semiconductor wafer or Liquid Crystal Display (LCD) panel using an optical device.

2. Description of the Related Art

Semiconductor wafers or LCD panels may have defects during patterning of circuits, etc. Searching and removing defects by inspecting a work piece may be necessary to increase yield. These defects may be broadly classified into open type defects and closed type defects. Open type defects occur when a target pattern is partially formed or omitted. In this case, adding the omitted pattern using laser chemical vapor deposition, etc. has been proposed. Closed type defects occur when an unnecessary pattern is formed, and thus, elimination of the unnecessary pattern may be necessary.

Most currently developed devices for elimination of defects only work for, e.g., formation or removal of a pattern one line at a time and therefore, an elimination operation time may significantly increase if the pattern of a defective region is complicated. In particular, the operation time may further increase in the case of a large-area LCD panel. Moreover, since elimination of defects from the large-area LCD panel may be easy, but repair of the defective region may be difficult, it may be impossible to acquire normal operation of devices or circuits.

SUMMARY

Therefore, it is an aspect of the present invention to provide a semiconductor manufacturing apparatus in which the position and size of a light spot formed on a substrate are precisely adjusted to realize formation of a target pattern or elimination of an unnecessary pattern in an accurate and rapid manner.

Additional aspects of the invention will be set forth in part in the description which follows and, in part, will be obvious from the description, or may be learned by practice of the invention.

In accordance with one aspect of the present invention, a semiconductor manufacturing apparatus includes a light source, a light modulator to modulate light irradiated from the light source into a plurality of beams to correspond to a target pattern, a diffraction element to adjust a direction of each of the plurality of beams, and a third optics system to allow the plurality of beams, the direction of which has been controlled by the diffraction element, to form a light spot having a target size.

The diffraction element may include a plurality of diffraction regions to adjust the direction of each of the plurality of beams.

Each of the plurality of diffraction regions may have at least one oblique line.

If the at least one oblique line includes a plurality of oblique lines, at least one of a thickness of and an interval between the oblique lines may be different on a per diffraction region basis.

The light modulator may include a plurality of micro mirrors, a reflection angle of which is changeable.

The light modulator may be a digital micro mirror device (DMD).

Each of the plurality of diffraction regions may correspond to any one or some of the plurality of micro mirrors.

The light may be introduced into and diffracted at the corresponding diffraction region as the reflection angle of each of the plurality of micro mirrors is changed.

The light modulator may be a Liquid Crystal Spatial Light Modulator (LCSLM).

The semiconductor manufacturing apparatus may further include a first optics system to transmit light emitted from the light modulator to the diffraction element, and a second optics system to transmit light emitted from the diffraction element to the third optics system.

The third optics system may include at least one objective lens.

In accordance with another aspect of the present invention, a semiconductor manufacturing apparatus includes a light source, a light modulator to modulate light irradiated from the light source into a plurality of beams to correspond to a target pattern, and a diffraction element to change a direction of each of the plurality of beams and form a light spot having a target size.

The diffraction element may include a plurality of diffraction regions to adjust the direction of each of the plurality of beams.

Each of the plurality of diffraction regions may have at least one circular line.

If the at least one circular line includes a plurality of circular lines, at least one of a thickness of and an interval between the circular lines may be different on a per diffraction region basis.

The light modulator may include a plurality of micro mirrors, a reflection angle of which is changeable.

The light modulator may be a digital micro mirror device (DMD).

Each of the plurality of diffraction regions may correspond to any one or some of the plurality of micro mirrors.

The light may be introduced into and diffracted at the corresponding diffraction region as the reflection angle of each of the plurality of micro mirrors is changed.

The light modulator may be a Liquid Crystal Spatial Light Modulator (LCSLM).

The semiconductor manufacturing apparatus may further include a first optics system to transmit light emitted from the light modulator to the diffraction element.

The diffraction element may be a zone plate.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1:
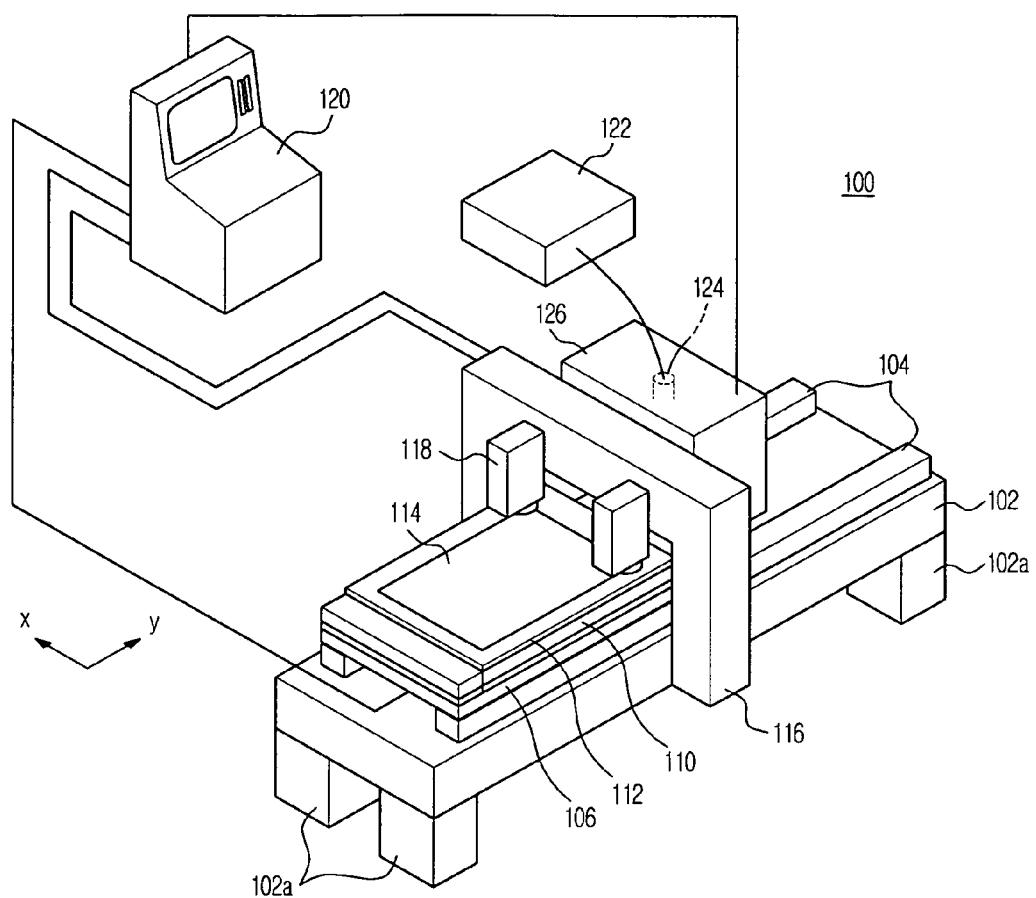
FIG. 1 is a view illustrating a semiconductor manufacturing apparatus according to one embodiment of the present invention.

Reference will now be made in detail to the embodiments of the present invention, examples of which are illustrated in the accompanying drawings, wherein like reference numerals refer to like elements throughout.

FIG. 1 is a view illustrating a semiconductor manufacturing apparatus according to one embodiment of the present invention. As illustrated in FIG. 1, the semiconductor manufacturing apparatus 100 is a flat bed type lithography apparatus, and includes a table 102 supported by four leg members 102a and a stage 106 movable in an x direction and y direction on guides 104 that are located over the table 102. A plurality of beam monitors 108 is fixedly installed to the stage 106. A chuck 110 and a substrate 120 are sequentially placed above the stage 106. A photoresist material 114, such as a photoresist coating layer, is applied to an upper surface of the substrate 112. A gate-shaped frame 116 is coupled to the center of the table 102 and two position sensors 118 are provided at the left side of the gate-shaped frame 116. The position sensors 118 sense movement of the stage 106 and transmit sensed signals to a control unit 120 that will be described hereinafter. As the stage 106 moves in x and −x directions and y and −y directions, the substrate 112 simultaneously moves in x and −x directions and y and −y directions.

A light source 122 to emit light, such as laser, and an optical head unit 126 are installed at the right side of the gate-shaped frame 116. Once the light from the light source 122 is introduced into the optical head unit 126, an optical head 124 irradiates multiple beams to the photoresist material 114 of the substrate 112 to form a target pattern on the substrate 112.

The control unit 120 controls a light modulator (not shown) to irradiate the multiple beams based on target pattern exposure data.

Figure 2:
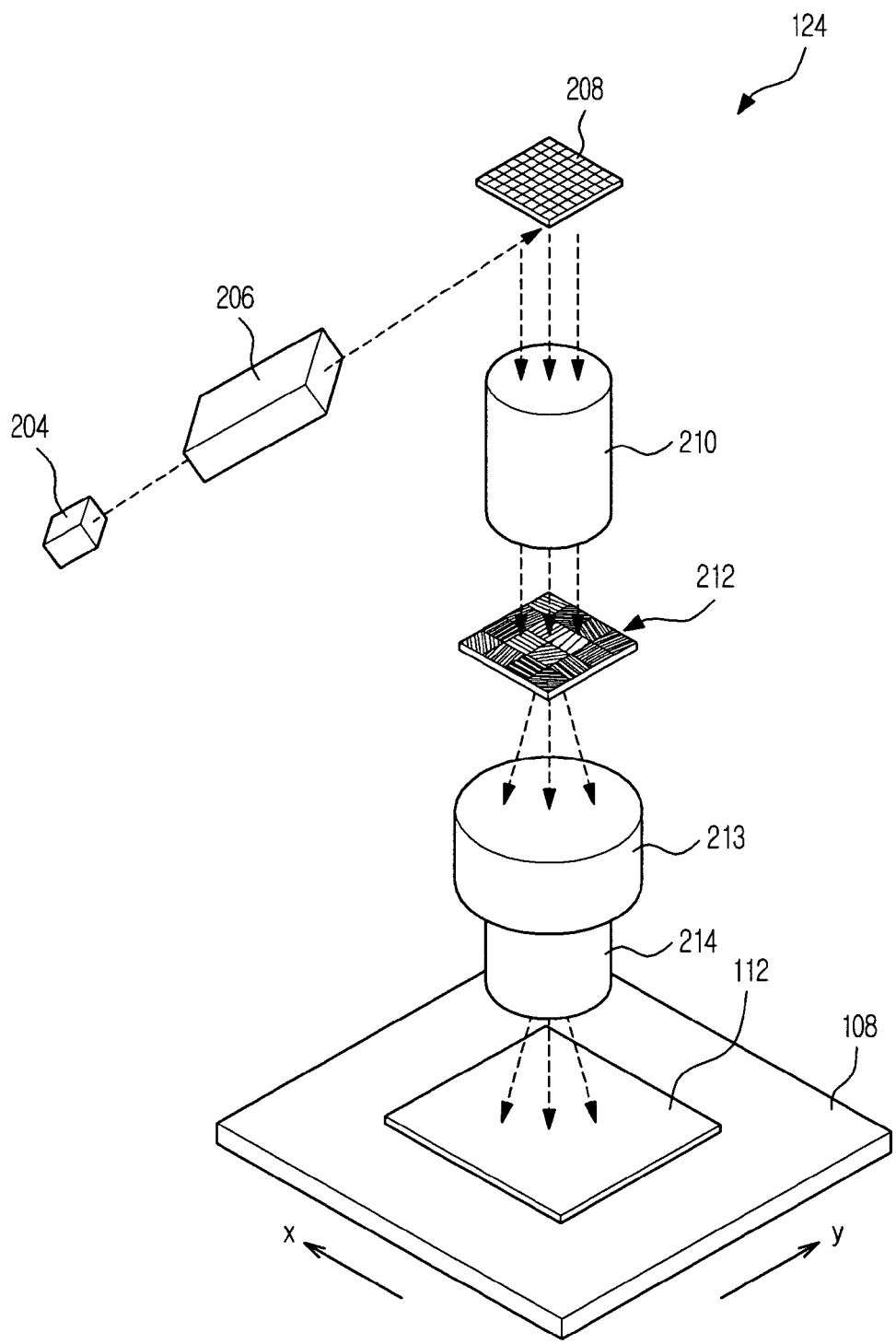
FIG. 2 is a view illustrating an optical head of the semiconductor manufacturing apparatus illustrated in FIG. 1.

FIG. 2 is a view illustrating the optical head of the semiconductor manufacturing apparatus illustrated in FIG. 1. As illustrated in FIG. 2, the optical head 124 includes a light source 204, an attenuator 206, a light modulator 208, a first optics system 210, a diffraction element 212, a second optics system 213, and a third optics system 214.

Examples of the light source 204 may include a semiconductor laser device or ultraviolet lamp. The attenuator 206 corrects light emitted from the light source 204 to provide the light with uniform illumination intensity. The first optics system 210 transmits light, modulated by the light modulator 208, to the diffraction element 212. If standards of the light modulator 208 and the diffraction element 212 differ from each other, a beam emitted from the light modulator 208 may not enter the diffraction element 212 completely. The first optics system 210 may be a relay optics system to allow the beam emitted from the light modulator 208 to completely enter the diffraction element 212. The light modulator 208 may be selected from among a Spatial Light Modulator (SLM), a Micro Electro Mechanical System (MEMS) type Digital Micro-mirror Device (DMD), an electro optical device using transmittable ceramic such as lead zirconate titantate (PLZT), a Ferroelectric Liquid Crystal (FLC) device, and so on. In particular, the light modulator 208 may be a DMD. The diffraction element 212 serves to adjust the interval and intensity of light transmitted through the first optics system 210. The second optics system 213 transmits the light from the diffraction element 212 to the third optics system 214. Similar to the first optics system 210, the second optics system 213 may be a relay optics system to allow the beam emitted from the diffraction element 212 to completely enter the third optics system 214. The third optics system 214 focuses a beam transmitted through the second optics system 213 on a surface of the substrate 112, thereby forming a light spot having a target size on a target position. The third optics system 214 may include at least one objective lens.

Figure 3:
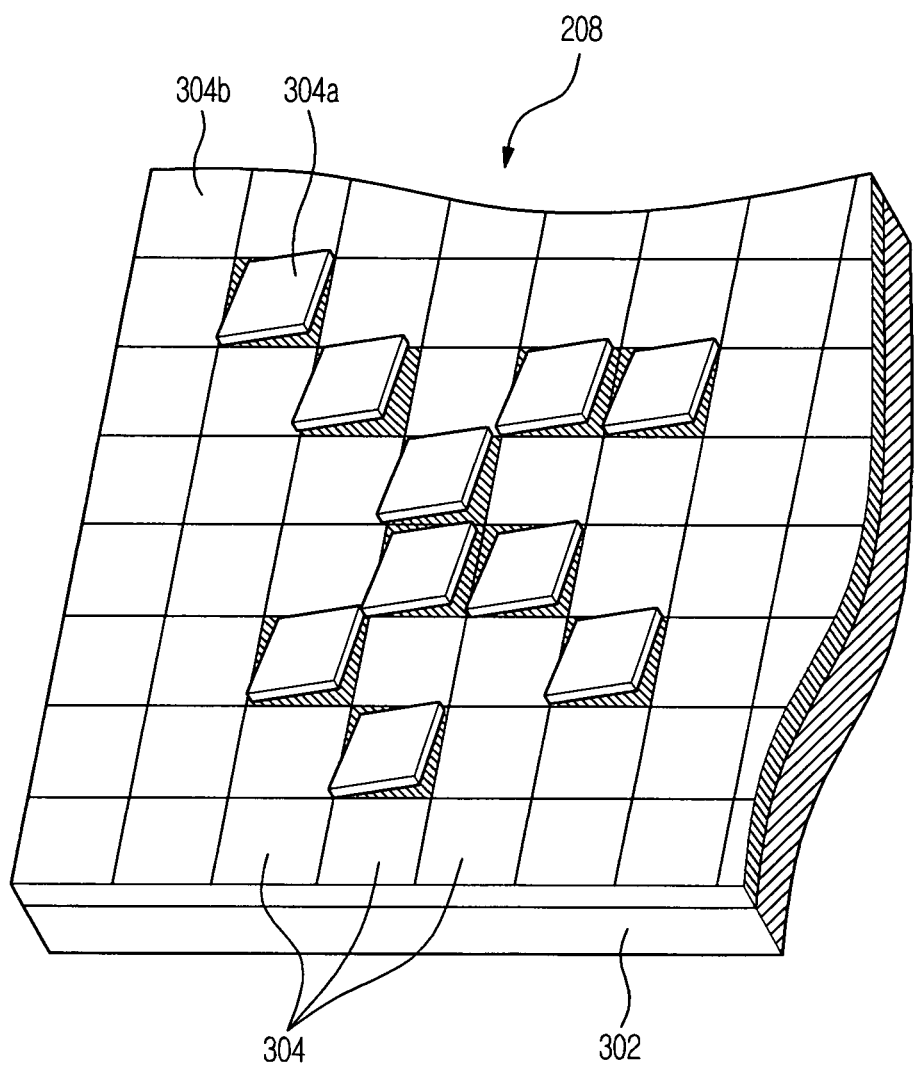
FIG. 3 is a view illustrating an example of a light modulator of the optical head illustrated in FIG. 2.

FIG. 3 is a view illustrating an example of the light modulator of the optical head illustrated in FIG. 2, and illustrates the configuration of a DMD. As illustrated in FIG. 3, the light modulator in the form of a DMD includes a memory cell 302 (for example, a Static Random Access Memory (SRAM) cell) and a plurality of micro mirrors 304 arranged in a matrix on the memory cell 302. The light modulator in the form of DMD may change angles of the respective micro mirrors 304 based on control signals generated in response to image data of a target pattern, thereby reflecting a necessary part of light to the first optics system 210 (this state is referred to as "turn-on") and reflecting the remaining light at a different angle so as not to be transmitted to the first optics system 210 (this state is referred to as "turn-off"). If a digital signal is recorded in the memory cell 302, some of the micro mirrors 304 are tilted by a predetermined angle (for example, 12°)(turn-on). In FIG. 3, some micro mirrors 304a are in a turn-on state and other micro mirrors 304b are in a turn-off state. Light reflected by the turned-on micro mirrors 304a (i.e. modulated light) is transmitted to the substrate 112 thus being used to expose the photoresist material 114, whereas light reflected by the turned-off micro mirrors 304b is not transmitted to the substrate 112 thus not being used to expose the photoresist material 114. With this selective exposure, a pattern is formed.

Figure 4:
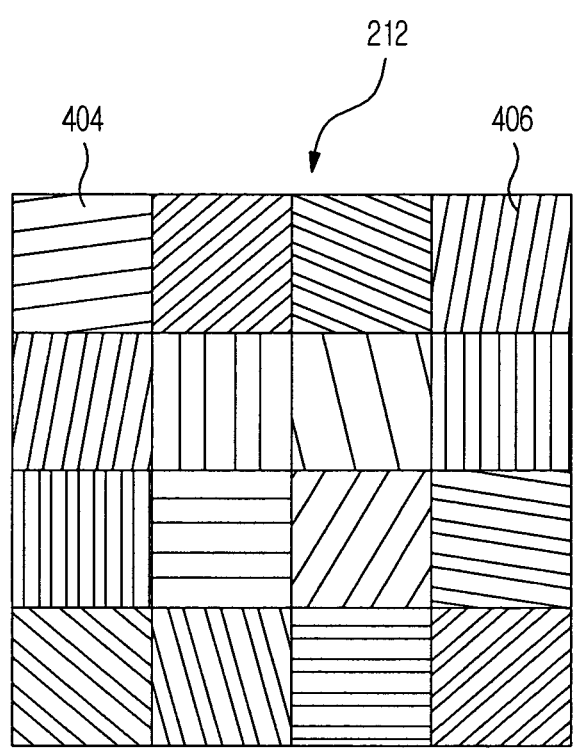
FIG. 4 is a view illustrating a diffraction element illustrated in FIG. 2.

FIG. 4 is a view illustrating the configuration of the diffraction element illustrated in FIG. 2. The diffraction element 212 illustrated in FIG. 4 is a diffraction grating matrix consisting of a plurality of diffraction regions 404. Each diffraction region 404 may have at least one, more particularly, a plurality of oblique lines 406. The diffraction element 212 splits and diffracts incident light into multiple beams that proceed in different directions. The direction of the beams is determined by an interval between the plurality of oblique lines 406 formed at the diffraction element 212 and the wavelength of the incident light. The oblique lines 406 consequently serve to distribute the incident light. The respective diffraction regions 404 of the diffraction element 212 illustrated in FIG. 4 have the oblique lines 406 having different thicknesses and/or intervals and thus, have different diffraction characteristics. Thereby, the direction of beams transmitted through the first optics system 210 is changed while passing through the diffraction element 212. In this way, it may be possible to guide the beams in a specific direction and as necessary, to diffuse the beams over a wider range. For example, the projection range of beams, arriving at the substrate 112 when all of the micro mirrors 304 of the light modulator 208 are turned on, is greater than the entire width of beams emitted from the light modulator 208 owing to diffusion of the diffraction element 212.

If each diffraction region 404 of the diffraction element 212 corresponds to any one or some of the micro mirrors 304 of the light modulator 208, it may be possible to transmit a beam to a target one of the diffraction regions 404 by controlling each micro mirror 304 to be turned on or turned off. Thus, it will be appreciated that the plurality of diffraction regions 404 of the diffraction element 212 may be selectively activated by controlling the light modulator 208. When combining the selective activation of the respective diffraction regions 404 with focus adjustment of the third optics system 214, it may be possible to adjust the position and size of the light spot formed on the substrate 112 and consequently, it may be possible to form or eliminate a target local pattern in an accurate and rapid manner.

Figure 5:
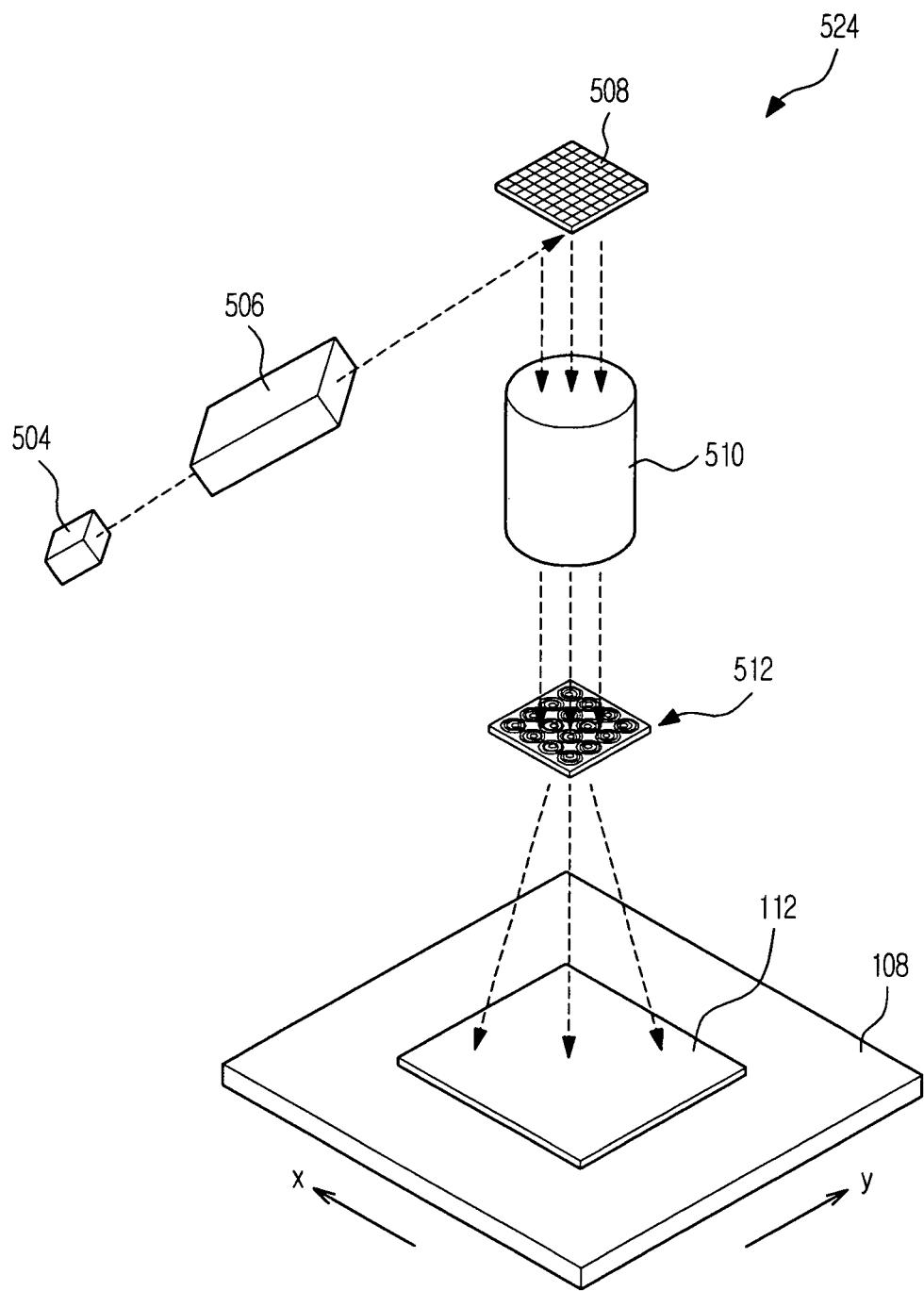
FIG. 5 is a view illustrating an optical head according to another embodiment of the present invention.

FIG. 5 is a view illustrating an optical head according to another embodiment of the present invention. As illustrated in FIG. 5, the optical head 524 includes a light source 504, an attenuator 506, a light modulator 508, a first optics system 510 and a diffraction element 512.

Examples of the light source 504 may include a semiconductor laser device or ultraviolet lamp. The attenuator 506 corrects light emitted from the light source 504 to provide the light with uniform illumination intensity. The first optics system 510 transmits light, modulated by the light modulator 508, to the diffraction element 512. The light modulator 508 may be selected from among an SLM, a MEMS type DMD, an electro optical device using transmittable ceramic such as PLZT, an FLC device, and so on. In particular, the light modulator 508 may be a DMD. The diffraction element 512 serves to adjust the interval and intensity of light transmitted through the first optics system 510 and to focus the light on the surface of the substrate 112, thereby forming a light spot having a target size on a target position. Differently from the optical head 124 of the above described embodiment as illustrated in FIG. 2 in which the size of the light spot is adjusted using the third optics system 214, in the optical head 524 according to the embodiment of FIG. 5, the diffraction element 512 functions to adjust the size of the light spot.

Figure 6:
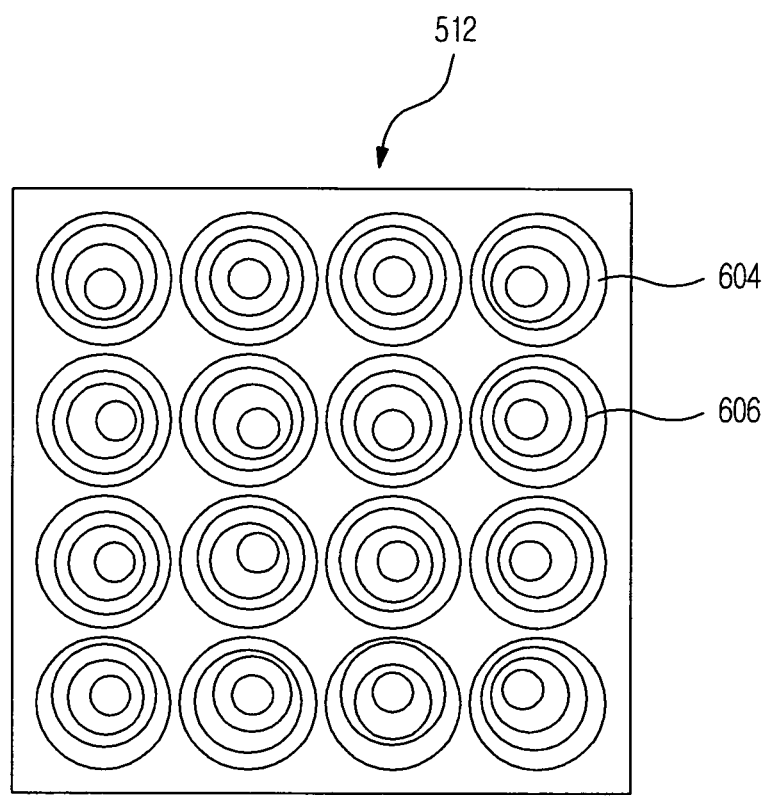
FIG. 6 is a view illustrating a diffraction element illustrated in FIG. 5.

FIG. 6 is a view illustrating the diffraction element illustrated in FIG. 5. The diffraction element 512 illustrated in FIG. 6 is a zone plate, more particularly, a modified zone plate array. The diffraction element 512 consists of a plurality of diffraction regions 604 and each diffraction region 604 has at least one, more particularly, a plurality of circular lines 606. The diffraction element 512 splits and diffracts incident light into multiple beams that proceed in different directions and focuses the multiple beams on a specific position. The direction of the beams is determined by an interval between the plurality of circular lines 606 formed at the diffraction element 512 and the wavelength of the incident light. The circular lines 606 consequently serve to distribute the light. Since the respective diffraction regions 604 of the diffraction element 512 illustrated in FIG. 6 have the circular lines 606 having different thicknesses and/or intervals, the plurality of diffraction regions 604 exhibits different degrees of diffraction respectively, causing the direction and focal distance of beams transmitted from the first optics system 510 to be changed while passing through the diffraction element 512. In particular, it will be appreciated in FIG. 6 that the plurality of circular lines 606 formed in the respective diffraction regions 604 are eccentrically deviated in specific different directions, rather than defining concentric circles having a common center. The direction of beams incident on the respective diffraction regions 604 is determined according to the eccentric direction and degree. In this way, it may be possible to change the direction of beams and as necessary, to disperse the beams over a wider range. For example, the projection range of beams, arriving at the substrate 112 when all of the micro mirrors (see 304 in FIG. 3) of the light modulator 508 are turned on, is greater than the entire width of beams emitted from the light modulator 508 owing to diffusion of the diffraction element 512.

If each diffraction region 604 of the diffraction element 512 corresponds to any one or some of the micro mirrors (see 304 in FIG. 3) of the light modulator 508, it may be possible to transmit a beam to a target one of the diffraction regions 604 by controlling each micro mirror to be turned on or turned off. Thus, it will be appreciated that the plurality of diffraction regions 604 of the diffraction element 512 may be selectively activated by controlling the light modulator 508. Thereby, it may be possible to adjust the position and size of the light spot formed on the substrate 112 and consequently, it may be possible to form or eliminate a target local pattern in an accurate and rapid manner.

As is apparent from the above description, with a semiconductor manufacturing apparatus according to an embodiment of the present invention, it may be possible to precisely adjust the position and size of a light spot formed on a substrate during a semiconductor manufacturing process. This enables more rapid and accurate formation of a target pattern or elimination of an unnecessary pattern.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor manufacturing apparatus comprising:
   a light source;
   a light modulator to modulate light irradiated from the light source into a plurality of beams to correspond to a target pattern;
   a diffraction element to adjust a direction of each of the plurality of beams; and
   a first optics system to allow the plurality of beams, the direction of which has been controlled by the diffraction element, to form a light spot having a target size,
   wherein the diffraction element includes a plurality of diffraction regions to adjust the direction of each of the plurality of beams, each of the plurality of diffraction regions includes a plurality of oblique lines, and at least one of a thickness of and an interval between the oblique lines is different on a per diffraction region basis.

2. The apparatus according to claim 1, wherein the light modulator includes a plurality of micro mirrors, a reflection angle of which is changeable.

3. The apparatus according to claim 2, wherein the light modulator is a digital micro mirror device (DMD).

4. The apparatus according to claim 2, wherein each of the plurality of diffraction regions corresponds to any one or some of the plurality of micro mirrors.

5. The apparatus according to claim 4, wherein the light is introduced into and diffracted at the corresponding diffraction region as the reflection angle of each of the plurality of micro mirrors is changed.

6. The apparatus according to claim 1, wherein the light modulator is a Liquid Crystal Spatial Light Modulator (LCSLM).

7. The apparatus according to claim 1, further comprising:
   a second optics system to transmit light emitted from the light modulator to the diffraction element; and
   a third optics system to transmit light emitted from the diffraction element to the third optics system.

8. The apparatus according to claim 1, wherein the third optics system includes at least one objective lens.

9. A semiconductor manufacturing apparatus comprising:
   a light source;
   a light modulator to modulate light irradiated from the light source into a plurality of beams to correspond to a target pattern; and
   a diffraction element to change a direction of each of the plurality of beams and form a light spot having a target size, wherein the diffraction element includes a plurality of diffraction regions to adjust the direction of each of the plurality of beams, each of the plurality of diffraction regions includes a plurality of circular lines, at least one of a thickness of and an interval between the circular lines is different on a per diffraction region basis, and the plurality of circular lines are eccentrically deviated.

10. The apparatus according to claim 9, wherein the light modulator includes a plurality of micro mirrors, a reflection angle of which is changeable.

11. The apparatus according to claim 10, wherein the light modulator is a digital micro mirror device (DMD).

12. The apparatus according to claim 10, wherein each of the plurality of diffraction regions corresponds to any one or some of the plurality of micro mirrors.

13. The apparatus according to claim 12, wherein the light is introduced into and diffracted at the corresponding diffraction region as the reflection angle of each of the plurality of micro mirrors is changed.

14. The apparatus according to claim 9, wherein the light modulator is a Liquid Crystal Spatial Light Modulator (LCSLM).

15. The apparatus according to claim 9, further comprising:
 a first optics system to transmit light emitted from the light modulator to the diffraction element.

16. The apparatus according to claim 9, wherein the diffraction element is a zone plate.

* * * * *